United States Patent [19]

Hiesbock et al.

[11] Patent Number: 5,045,410

[45] Date of Patent: * Sep. 3, 1991

[54] LOW PHOSPHORUS CONTAINING BAND-SHAPED AND/OR FILAMENTARY MATERIAL

[75] Inventors: Heinz G. Hiesbock, Modling; Karl Bartl, Vienna, both of Austria

[73] Assignee: Karl Neumayer, Erzeugung und Vertrieb von Kabeln, Drahten isolierten Leitungen ur Elektromaterial Gesellschaft mit beschrankter Haftung, Gunselsdorf, Austria

[*] Notice: The portion of the term of this patent subsequent to Apr. 25, 2006 has been disclaimed.

[21] Appl. No.: 375,968

[22] Filed: Jul. 3, 1989

Related U.S. Application Data

[63] Continuation-in-part of Ser. No. 145,743, Jan. 19, 1988, abandoned, which is a continuation of Ser. No. 880,014, Jun. 30, 1986, abandoned.

[30] Foreign Application Priority Data

Dec. 13, 1985 [AT] Austria .............. A 3610/85

[51] Int. Cl.$^5$ .................................. H01R 13/03
[52] U.S. Cl. ...................... 428/644; 428/647; 428/648; 428/675; 428/929; 439/886; 439/887
[58] Field of Search ............ 439/83, 84, 876, 886, 439/887; 428/607, 645, 644, 674, 675, 680, 647, 643, 648, 929

[56] References Cited

U.S. PATENT DOCUMENTS

| | | | |
|---|---|---|---|
| 1,509,102 | 9/1924 | Dana | 428/645 |
| 2,079,479 | 5/1937 | Bennett | 428/644 |
| 2,079,480 | 5/1937 | Bennett | 428/644 |
| 2,079,481 | 5/1937 | Bennett | 428/645 |
| 2,079,482 | 5/1937 | Bennett | 428/644 |
| 2,079,483 | 5/1937 | Bennett | 428/644 |
| 2,079,484 | 5/1937 | Bennett | 428/645 |
| 2,718,494 | 9/1955 | Faust | 428/645 |
| 2,897,584 | 8/1959 | Schumpelt | 439/886 |
| 3,676,088 | 7/1972 | Pryor et al. | 29/199 |
| 3,821,692 | 6/1974 | Barnard | 439/886 |
| 3,864,014 | 2/1975 | Lynch | 439/876 |
| 3,915,546 | 10/1975 | Cobaugh et al. | 439/876 |
| 3,923,558 | 12/1975 | Shapiro et al. | 148/32.5 |
| 4,279,967 | 6/1981 | Sawada | 428/644 |
| 4,357,069 | 11/1982 | Milora | 439/876 |
| 4,441,118 | 4/1984 | Fister et al. | 357/70 |
| 4,524,241 | 6/1985 | Binder et al. | 174/119 |
| 4,559,200 | 12/1985 | Yamasaki et al. | 420/492 |
| 4,591,536 | 5/1986 | Hodes et al. | 428/645 |
| 4,824,737 | 4/1989 | Hiesbock et al. | 428/643 |

FOREIGN PATENT DOCUMENTS

| | | | |
|---|---|---|---|
| 385932 | 12/1985 | Austria . | |
| 0032326 | 7/1981 | European Pat. Off. . | |
| 2420573 | 1/1975 | Fed. Rep. of Germany . | |
| 2601765 | 7/1976 | Fed. Rep. of Germany . | |
| 3429393 | 2/1985 | Fed. Rep. of Germany . | |
| 3628783 | 10/1987 | Fed. Rep. of Germany | 439/887 |

(List continued on next page.)

OTHER PUBLICATIONS

Berg Solder-Washer BergPin, Data Sheet 501, Dec. 1982, 4 pages.
Hutte Taschenbuch fur Eisenhuttenleute, 5. Auflage, Berlin, 1961, S. 1143.
Stahl Eisen Werkstoffblatt (Steel Iron Specification Sheet), 028-59, 1st edition, Jan. 1959.

*Primary Examiner*—John J. Zimmerman
*Attorney, Agent, or Firm*—Fleit, Jacobson, Cohn, Price, Holman & Stern

[57] ABSTRACT

A band-shaped and/or filamentary material, having a phosphorus containing metal and/or metal alloy inner layer such as phosphor bronze, deoxidized copper or other similar phosphorus containing material, and a lead alloy outer layer, particularly a lead-tin alloy, wherein the phosphorus content of the inner layer is between 0.03 and 0.13 weight percent. In the preferred embodiment, the amount of phosphorus in the inner layer is between 0.05 and 0.06 weight percent. Electrical conductors and electronic components of this band-shaped and/or filamentary material are also disclosed.

17 Claims, 3 Drawing Sheets

FOREIGN PATENT DOCUMENTS

| | | |
|---|---|---|
| 3625543 | 3/1988 | Fed. Rep. of Germany . |
| 1512235 | 12/1967 | France . |
| 1570993 | 6/1969 | France . |
| 2127826 | 2/1972 | France . |
| 2482791 | 11/1981 | France .................................. 439/887 |
| 2591518 | 6/1987 | France . |
| 54-23031 | 2/1979 | Japan ................................... 428/644 |
| 54-74248 | 6/1979 | Japan . |
| 55-151710 | 11/1980 | Japan ................................... 428/607 |
| 60-17038 | 6/1983 | Japan . |
| 60-177991 | 11/1985 | Japan . |
| 1117684 | 2/1966 | United Kingdom . |
| 1185786 | 5/1968 | United Kingdom . |
| 1382201 | 2/1972 | United Kingdom . |
| 1466794 | 4/1974 | United Kingdom . |
| 1476599 | 12/1975 | United Kingdom . |
| 2185704 | 7/1987 | United Kingdom . |

LOW PHOSPHORUS CONTAINING BAND-SHAPED AND/OR FILAMENTARY MATERIAL

This application is a continuation-in-part of U.S. Ser. No. 145,743, filed Jan. 19, 1988, abandoned, which is a continuation of U.S. Ser. No. 880,014, filed June 30, 1986, abandoned

BACKGROUND OF THE INVENTION

1. Field of the Invention

The present invention relates to a band-shaped and/or a filamentary (wire-shaped) material, which is particularly useful as a solderable electrical conductor. The material of the invention comprises an inner layer of metal, metal alloy, or metal and metal alloy containing phosphorus, specifically between 0.03% and 0.13% by weight of the inner layer, and an outer layer which is a lead alloy. The inner layer may be an alloy such as phosphor bronze, deoxidized copper or similar materials, and the preferred outer layer is a lead-tin alloy. The invention further relates to the use of this material as an electrical conductor.

2. Description of Prior Art

Materials which have an inner layer of a metal and/or metal alloy containing phosphorus and an outer layer containing a lead alloy are used, by preference, in the electric and electronic industries, where solderability and corrosion resistance of the materials are of primary importance. Typically, the inner layer is primarily copper, with amounts of tin and phosphorus also present. The phosphorus content is approximately 0.30 weight percent of the inner layer.

It has been found, however, that materials of this kind age or break down, in the sense that, over the course of time, they lose their moistening power in relation to liquid tin-alloys and/or tin with respect to solderability. Therefore, a particular disadvantage of these known materials is that the aging process including the loss of solderability occurs rather rapidly, with time periods varying from five to twelve weeks being common.

SUMMARY OF THE INVENTION

It is an object of the invention to eliminate the disadvantages associated with prior compositions, which have preferably been used as solderable materials.

It is a further object to provide a band-shaped and/or filamentary material with an inner layer of a metal and/or metal alloy and an outer layer, in which the aging process relating to the loss of solderability takes place at a considerably slower rate, so slowly that solderability will be maintained during usual time periods of up to one year between production and processing of the material.

It is an additional object of the present invention to provide a barrier layer of metal between the metal and/or metal alloy inner layer and the outer layer of the inventive material to further extend the storage period of the material.

It is still another object of the invention to provide electrical conductors and electronic components comprising the inventive material, wherein solderability of the material of the invention is retained for extended periods of storage time.

The band-shaped and/or filamentary materials of the present invention are particularly suitable for use as electrical conductors, e.g., connection leads, pins, plug contacts, relay connector pins, terminal pins and the like, in electronic components such as capacitors, semiconductor chips and transformers The materials of the present invention are also useful as pins in pin connectors, which pin connectors may be electronic components per se or may be soldered with printed circuit boards. Electrical conductors comprising a band-shaped and/or filamentary material of this invention have an extended shelf-life and exhibit good solderability when inserted into an electronic component by soldering, regardless of the length of the storage period of the electrical conductor.

BRIEF DESCRIPTION OF THE DRAWINGS

Additional objects and features of the present invention will be further understood with reference to the drawings wherein.

DETAILED DESCRIPTION OF PREFERRED EMBODIMENTS

Figure 1:
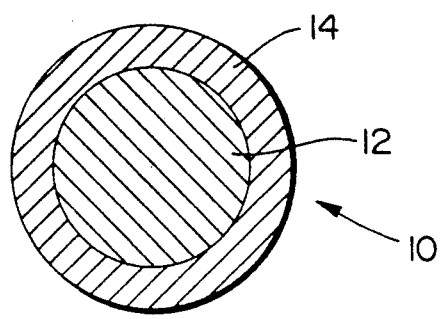
FIG. 1 is a cross-sectional view of a first embodiment of a filamentary material of the present invention.

In describing the preferred embodiments of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

Figure 3:
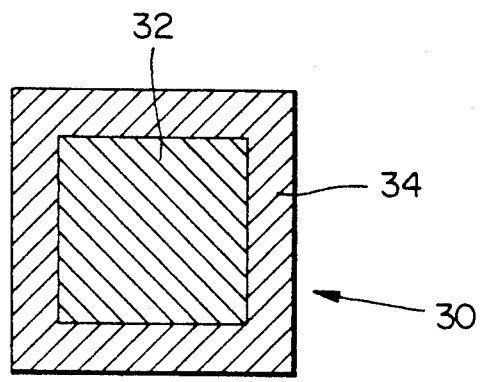
FIG. 3 is a cross-sectional view of a first embodiment of a band-shaped material of the present invention.

Referring now to the drawings, FIG. 1 shows a cross section of a filamentary material 10 of the invention which is comprised of an inner layer 12 and an outer layer 14. FIG. 3 shows a cross section of a band-shaped material 30 of the invention having an inner layer 32 and an outer layer 34. According to one preferred embodiment of the invention, the inner layer 12, 32 of the inventive material is a metal and/or metal alloy, preferably, copper, tin and phosphorus, and the outer layer 14, 34 is comprised of a lead alloy, preferably a lead-tin alloy. In specific embodiments, the inner layer 12, 32 may be comprised of phosphor bronze, deoxidized copper, or other materials. Preferably, the inner layer consists of copper, up to 10% by weight tin, based on the total weight of the inner layer, and phosphorous.

According to the invention, the phosphorus content of inner layer 12, 32 of the material is between 0.03 and 0.13 percent by weight of inner layer 12, 32, and preferably between 0.05 and 0.06 percent by weight.

Considerably higher phosphorus percentages have been present in known band-shaped and/or filamentary materials, particularly those used as solderable materials. The inventors have discovered that when high amounts of phosphorus are present in the inner layer, such as 0.30 percent by weight of the inner layer in the case of a known phosphor bronze solderable material inner layer, the material loses its solderability because of the high phosphorus content.

One had been, up to this time, of the opinion, according to theory and practice, that the cause of the loss of solderability was the diffusion of copper out of the original material of an inner layer and into a tinlead alloy outer layer, and conversely the diffusion of tin out of the outer layer into the metal and/or metal alloy inner layer. The inventors have recognized that it is the diffusion of phosphorus out of inner layer 12, 32 into outer layer 14, 34 that causes the rapid deterioration of solderability.

When, in accordance with the invention, the phosphorus content is established at no more than 0.13 percent by weight of inner layer 12, 32, while the amounts of the other components in the metal and/or metal alloy inner layer 12, 32 remain the same proportionally, storage periods of at least two years occur during which solderability is not lost.

In addition, it is now also possible to ascertain that the fluctuations of solderability that occur in known materials as a function of the storage period can be prevented.

Phosphorus contents within the range of 0.05 to 0.06 percent by weight of inner layer 12, 32 have been found to be especially advantageous.

Additionally, in accordance with the materials of the invention, the long time adhesive strength of the coating of a tin-lead alloy outer layer in relation to the phosphorus-containing metal and/or metal alloy inner layer is increased considerably. When materials known in the art having a high phosphorus content are bent after a storage period of five months to one year, it has been found that the outer layer has a tendency to partially peel off. When using the materials of the invention, this phenomenon is not seen.

Figure 2:
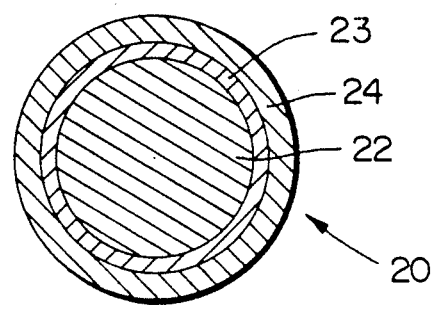
FIG. 2 is a cross-sectional view of a second embodiment of a filamentary material of the present invention.
Figure 4:
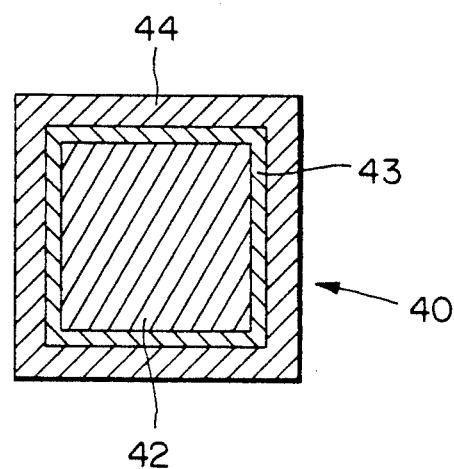
FIG. 4 is a cross-sectional view of a second embodiment of a band-shaped material of the present invention.

Referring now to FIG. 2, there is shown a cross section of another embodiment of a filamentary material 20 of the present invention. The filamentary material 20 has an inner layer 22 which is comprised of a metal and/or metal alloy containing phosphorus in amounts between 0.03 and 0.13 percent by weight of inner layer 22, an outer layer 24 which is comprised of a lead alloy, and a barrier layer 23 inserted between inner layer 22 and outer layer 24. FIG. 4 shows a cross section of a band-shaped material 40 of the present invention which has an inner layer 42, an outer layer 44 and a barrier layer 43 inserted between inner layer 42 and outer layer 44. The composition of inner layer 42 and outer layer 44 of band-shaped material 40 is the same as that of corresponding inner layer 22 and outer layer 24 of filamentary material 20. The barrier layer is used to further reduce the diffusion of phosphorus into the outer layer. The barrier layer 23, 43 of the inventive material 20, 40 may be made of any suitable metal, preferably nickel or, more preferably, copper. The thickness of the barrier layer should be at least 0.002 millimeters.

EXAMPLE 1

A known material has an inner layer of phosphor bronze which contains 5 weight percent tin, 94.7 weight percent copper, and 0.3 weight percent phosphorus, and an outer layer of a tin lead alloy which contains 5 weight percent lead and 95 weight percent tin. The storage period during which solderability is not lost in this material is approximately two to five months. These values of storage time vary widely because the phosphorus is distributed within the inner layer of phosphor bronze in a highly discontinuous manner, so that charges may easily be present in which the storage period is considerably shorter than in other charges.

EXAMPLE 2

The same material as in Example 1 is prepared except that the phosphorus content of inner layer is lowered to no more than 0.13 percent by weight while the amounts of copper and tin are proportionally increased to compensate for the lowering of the amount of phosphorus. The outer layer is the same as in Example 1. The storage period in which solderability is not lost in this material is at least two years.

EXAMPLE 3

The same material as in Example 2 was prepared except that a 0.002 mm thick copper barrier layer was inserted between the inner layer and the outer layer. The storage period of this material without loss of solderability exceeded the period of Example 2.

EXAMPLE 4

This is an example of solderable pins or lead wires for a capacitor comprising a filamentary material of the present invention. The pins are in the form of a wire or filamentary material and are intended to be inserted into holes in a printed circuit board and soldered therewith, in a conventional manner. According to the present invention, solderable pins or lead wires for a capacitor have the following composition and dimensions:

| | |
|---|---|
| Diameter: | 0.635 mm |
| Inner layer (by weight): | Sn 3.5–6.5%, preferably 5% |
| | P 0.07–0.1% |
| | Cu balance |
| Outer layer (by weight): | Sn 95% |
| | Pb 5% |
| Outer layer thickness: | 5 μm. |

EXAMPLE 5

This is an example of solderable pins or lead wires for a coil shell for a coil or a coil shell of a transformer comprising a filamentary material of the present invention. The pins or lead wires are in the form of a wire or filamentary material, and can be inserted into the holes of a printed circuit board and soldered therewith, in a conventional manner. According to the present invention, solderable pins for a coil shell have the following composition and dimensions:

| | |
|---|---|
| Diameter: | 1 mm |
| Inner layer (by weight): | Sn 4–6%, preferably 5% |
| | P 0.03–0.05% |
| | Cu balance |
| Outer layer (by weight): | Sn 90% |
| | Pb 10% |
| Outer layer thickness: | 6–8 μm. |

EXAMPLE 6

Figure 5:
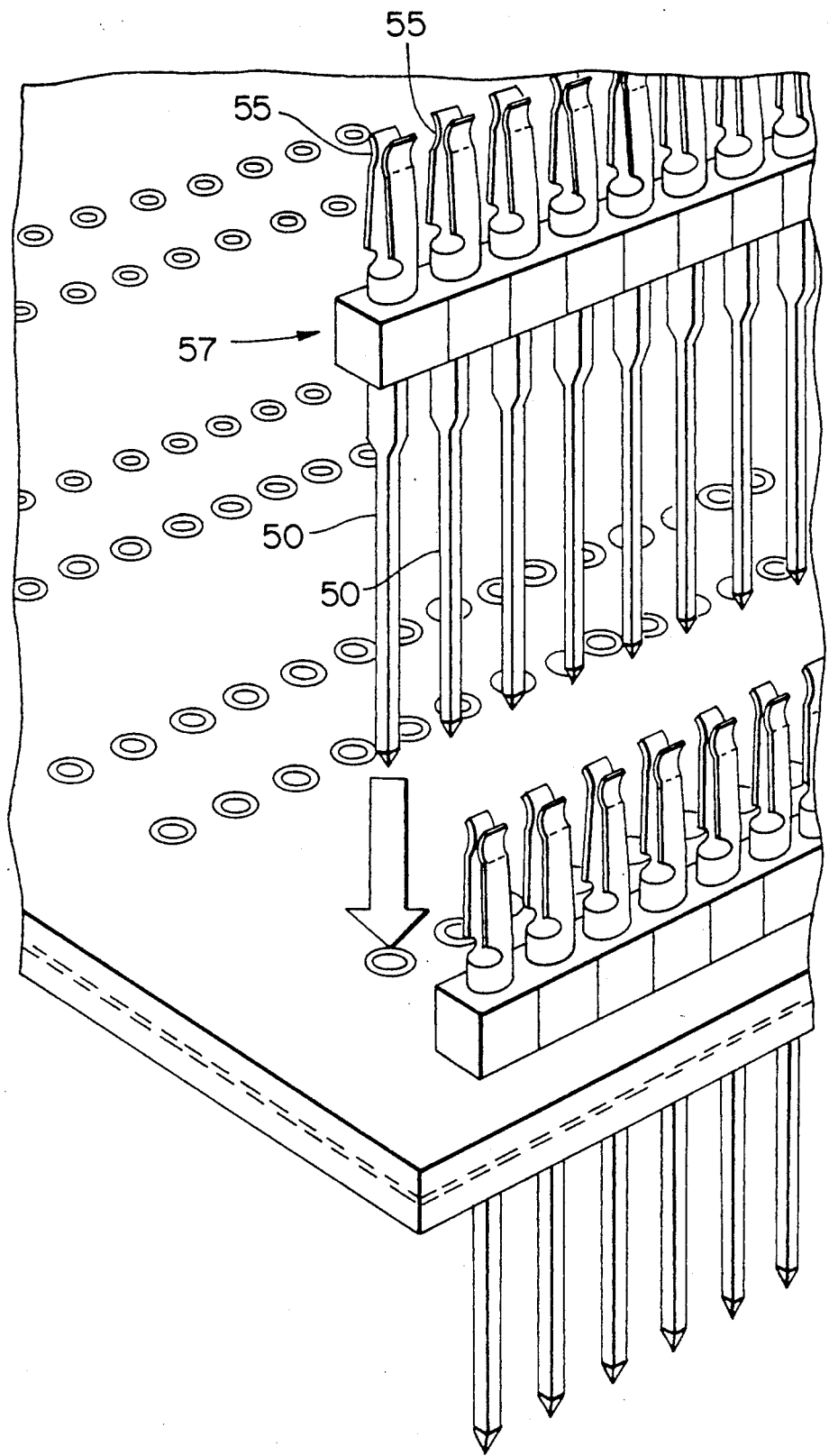
FIG. 5 is a portion of a contact array of a pin connector having pins of a band-shaped material of the present invention.

This is an example of a pin connector, which is itself an electronic component, comprising band-shaped pins of the present invention These pins are band-shaped and have a square cross section, as shown in FIG. 3, over substantially the length thereof. A plurality of pins of the inventive material, are incorporated in the pin connector in a typical contact array, as shown in FIG. 5.

Each pin 50 is associated with a respective contact 55 in the typical contact array 57. According to this invention, pins suitable for use in a pin connector which is an electronic component per se, have the following composition and dimensions:

| | |
|---|---|
| Cross section ( ): | 0.625 mm |
| Inner layer (by weight): | Sn 6–9%, preferably 8% |
| | P 0.07–0.13% |
| | Cu balance |
| Outer layer (by weight): | Sn 95% |
| | Pb 5% |
| Thickness of outer layer: | 4–6 μm. |

EXAMPLE 7

Figure 6:
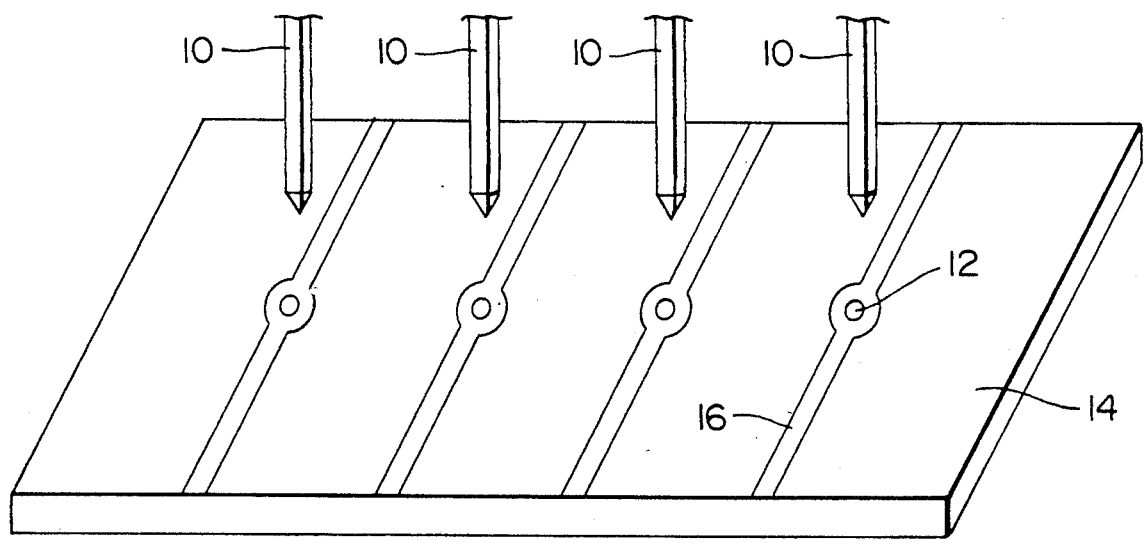
FIG. 6 is a schematic illustration of the relationship between electrical conductors in the form of pins of the inventive material and a printed circuit board.

This is an example of a pin connector for printed circuit boards of the present invention. The pin connector comprises pins which are band-shaped and have a square cross section, as shown in FIG. 3, over substantially the length thereof. A plurality of pins of the inventive material are incorporated in a pin connector for a printed circuit board in a typical contact array, such as that shown in FIG. 5. FIG. 6 schematically shows the relationship between a pin connector comprising inventive band-shaped pins 10 and a printed circuit board 14. Pins 10 are inserted in pin holes 12 formed in conductive paths 16 and then soldered therewith. Pins suitable for use in a pin connector of the present invention for a printed circuit board have the following composition and dimensions:

| | |
|---|---|
| Cross section ( ): | 1.14 mm |
| Inner layer (by weight): | Sn 6.5–9.5%, preferably 8% |
| | P 0.07–0.13% |
| | Cu balance |
| Barrier layer: | Cu |
| Outer layer (by weight): | Sn 60% |
| | Pb 40% |
| Barrier layer thickness: | 2 μm |
| Outer layer thickness: | 4–6 μm. |

From the above, it is apparent that many modifications and variations of the present invention are possible in light of the above teachings. It is, therefore, to be understood that, within the scope of the appended claims, the invention may be practiced otherwise than as specifically described.

What is claimed is:

1. A solderable band-shaped or filamentary material having an extended shelf-life, said solderable material comprising an inner layer consisting essentially of copper 3.5 to 9.5% by weight tin and 0.03 to 0.13% by weight phophorous, based on the total weight of the inner layer, and an outer layer of a lead alloy.

2. A solderable material according to claim 1, wherein the outer layer consists of a lead-tin alloy.

3. A solderable material according to claim 2, wherein said outer layer consists of 60 to 95% by weight tin and 5 to 40% by weight lead, based on the total weight of the outer layer.

4. A solderable material according to claim 3, wherein said outer layer has a thickness of 4 to 8 μm.

5. A solderable material according to claim 2, further comprising a barrier layer between said inner layer and said outer layer, said barrier layer comprising copper, nickel or a mixture thereof.

6. A solderable material according to claim 5, wherein said solderable material is a band-shaped material, said inner layer consists of 6.5 to 9.5% by weight tin, 0.07 to 0.13% by weight phosphorous and balance copper, said barrier layer consists of copper, and said outer layer consists of 60% by weight tin and 40% by weight lead.

7. A solderable material according to claim 1, wherein said solderable material is a filamentary material, said inner layer consists of 3.5 to 6.5% by weight tin, 0.07 to 1.0% by weight phosphorous and the balance copper, and said outer layer consists of 95% by weight tin and 5% by weight lead.

8. A solderable material according to claim 1, wherein said solderable material is a filamentary material, said inner layer consists of 4 to 6% by weight tin, 0.03 to 0.05% by weight phosphorous and the balance copper, and said outer layer consists of 90% by weight tin and 10% by weight lead.

9. A solderable material according to claim 1, wherein said solderable material is a band-shaped material, said inner layer consists of 6 to 9% by weight tin, 0.07 to 0.13% by weight phosphorous and the balance copper, and said outer layer consists of 95% by weight tin and 5% by weight lead.

10. An electrical conductor comprising a solderable band-shaped or filamentary material having an extended shelf-life, said solderable material comprising an inner layer consisting essentially of copper, 3.5 to 9.5% by weight tin and 0.3 to 0.13% by weight phosphorous, based on the total weight of the inner layer, and an outer layer consisting essentially of tin and lead.

11. An electrical conductor according to claim 10, wherein said solderable material further comprises a barrier layer between said inner layer and said outer layer, said barrier layer consisting essentially of copper, nickel or a mixture thereof.

12. An electrical conductor according to claim 10, wherein the outer layer of said solderable material consists of 60 to 95% by weight tin and 5 to 40% by weight lead.

13. An electrical conductor according to claim 12, wherein said solderable material further comprises a barrier layer between said inner layer and said outer layer, said barrier layer consisting of copper.

14. An electronic component at least one electrical conductor, said electric conductor being a solderable band-shaped or filamentary material comprising an inner layer consisting essentially of copper, 3.5 to 9.5% by weight tin, and 0.3 to 0.13% by weight phosphorous, based on the total weight of the inner layer, and an outer layer consisting of a lead alloy.

15. An electronic component according to claim 14, wherein said electronic component is a pin connector comprising a plurality of said electrical conductors provided in a contact array, each of said electrical conductors being associated with a contact in said contact array.

16. An electronic component according to claim 14, wherein said electronic component is a capacitor comprising at least two electrical conductors, said electrical conductors forming lead wires for said capacitor.

17. An electronic component according to claim 14, wherein said electronic component is a coil shell comprising a plurality of said electrical conductors, said electrical conductors forming lead wires for said coil shell.

* * * * *